United States Patent [19]

Yao

[11] Patent Number: 5,746,591

[45] Date of Patent: May 5, 1998

[54] SEMICONDUCTOR FURNACE FOR REDUCING PARTICULATES IN A QUARTZ TUBE AND BOAT

[75] Inventor: Liang-Gi Yao, Taipei, Taiwan

[73] Assignee: Vanguard International Semiconductor Corporation, Hsinchu, Taiwan

[21] Appl. No.: 700,739

[22] Filed: Aug. 15, 1996

[51] Int. Cl.$^6$ .................................................. F27D 3/12
[52] U.S. Cl. ........................... 432/241; 432/5; 432/253
[58] Field of Search ....................... 432/5, 9, 11, 152, 432/153, 239, 241, 245, 253

[56] References Cited

U.S. PATENT DOCUMENTS

| | | | |
|---|---|---|---|
| 5,207,573 | 5/1993 | Miyagi et al. | 432/253 |
| 5,329,095 | 7/1994 | Okase | 432/152 |
| 5,360,336 | 11/1994 | Monoe | 432/5 |
| 5,370,371 | 12/1994 | Miyagi et al. | 432/254.2 |
| 5,616,264 | 4/1997 | Nishi et al. | 219/494 |
| 5,632,820 | 5/1997 | Taniyama et al. | 432/242 |

Primary Examiner—Henry A. Bennett
Assistant Examiner—Gregory A. Wilson
Attorney, Agent, or Firm—Christensen, O'Connor, Johnson & Kindness PLLC

[57] ABSTRACT

The present invention is an improved semiconductor furnace system that reduces particles in the quartz tube and wafer boat. The cooling rate of conventional furnaces is too rapid in currently used processes. The thermal process includes high stress from polymorphic transformation, which causes the peeling of a polysilicon film and microcracking of the quartz tube and wafer boat. The present invention includes a bottom plate, a furnace tube, a wafer boat, a cooling water means, a thermocouple, a first heating element, and a second heating element. The second heating element limits the heating or cooling rates of the furnace to the range of 0.1°–2° C./min to reduce the temperature gradient inside the furnace tube. Therefore, the thermal stress that is caused by the phase transition of the quartz is reduced by the invention and the particles and microcrack issues are also reduced by the invention.

16 Claims, 3 Drawing Sheets

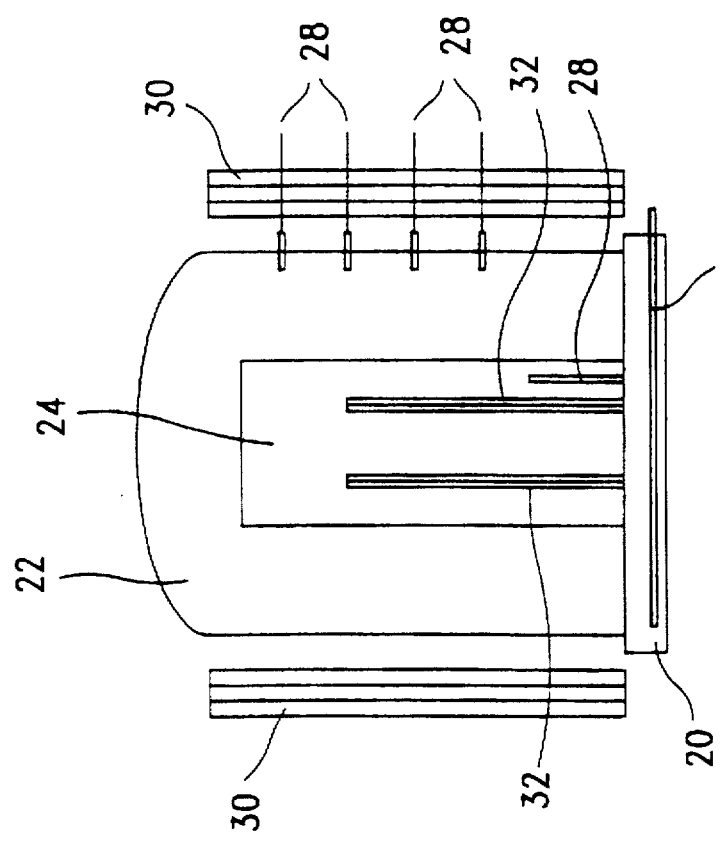
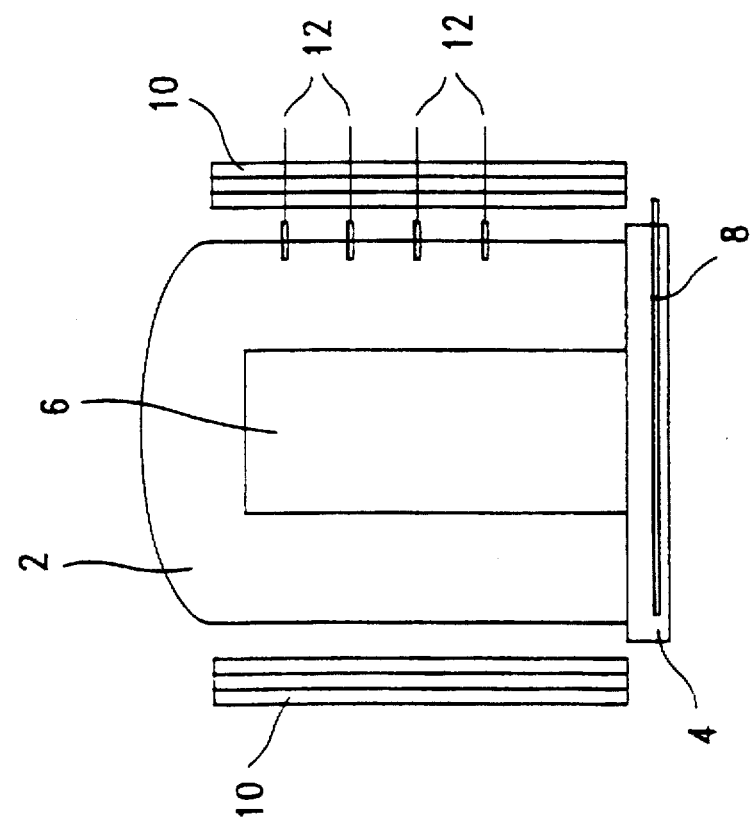
FIG. 2
FIG. 1
(PRIOR ART)

SEMICONDUCTOR FURNACE FOR REDUCING PARTICULATES IN A QUARTZ TUBE AND BOAT

FIELD OF THE INVENTION

The present invention relates to semiconductor furnaces, and more particularly, to a semiconductor furnace having reduced particulates in the quartz tube and boat.

BACKGROUND OF THE INVENTION

The semiconductor furnace is a cornerstone of the semiconductor manufacturing process. Common processes such as oxidation, diffusion, chemical vapor deposition, and annealing are performed in a furnace.

The "hot wall" type electric furnace has been used in the semiconductor industry for over 30 years. Such furnaces were originally designed for diffusion. More recently, these furnaces have also been used for low pressure chemical vapor deposition process.

In VLSI fabrication, the accurate control of oxide thickness and reduction in defects are more important than ever. The hot wall electric furnace is favored because batch processes are possible. Further, the hot wall furnace has excellent temperature stability. However, the hot wall furnace does have relative difficulty in providing precise temperature control.

Another type of furnace use is the so called a "lamp annealing" furnace. The lamp annealing furnace has the advantage that a plurality of wafers can be treated and the process temperature can be precisely controlled. However, the lamp annealing furnace does not currently provide uniform temperature distribution over the entire wafer surface relative to the hot wall furnace.

Modern hot wall horizontal diffusion furnaces are capable of controlling temperature over the range of 300°–1200° C. to an accuracy of 0.5° or –0.5° C. over a length of up to 40 inches. A recent development in furnace technology is the vertical furnace. The major advantage of the vertical furnace system offers over a conventional system are (1) no cantilever or soft-landing is required since the wafers are held in a quartz boat which does not touch the process tube walls (2) the wafers can be loaded and unloaded automatically; (3) the clean room footprint of the system is somewhat smaller than for the conventional horizontal configuration. See, e.g. P. Burggraaf, "Vertical Furnaces", *Semiconductor International*, April, 1986.

A quartz tube having a precoating of polysilicon on the tube is widely used for the deposition or annealing process. The main purpose of the polysilicon deposition is to reduce the power loss due to quartz reflection or radiation, and to protect the boat lifetime during periodical maintenance by wet etching.

FIG. 1 shows in schematic form a conventional vertical furnace system. A quartz furnace tube 2 is set on a bottom plate 4. A wafer boat 6 which carries wafers to be processed is set in the furnace tube 2. The furnace tube 2 serves to isolate the wafers and to provide heating. A cooling water means 8 is set in the bottom plate 4 for cooling down the temperature of the system when necessary.

Heating elements 10 are placed outside of the furnace tube 2 for providing heating of the furnace tube 2. Thermocouples 12 are set on the sidewall of the furnace tube 2 and pass through the side wall of the furnace tube 2 for detecting the temperature inside the furnace tube 2. When a process is completed, the process temperature must be cooled down to room temperature. However, the cooling rate of the furnace is too rapid in currently used processes. The rapid cooling thermal process results in high stress by polymorphic transformation, which causes the peeling of the polysilicon film of the furnace tube 2 and microcracking of the furnace tube 2 and wafer boat 6. The peeling of the polysilicon film not only affects the efficacy of the furnace tube 2, but also causes particles to be generated.

SUMMARY OF THE INVENTION

An improved semiconductor furnace system for processing semiconductor wafers is disclosed. The system comprises a bottom plate, a quartz furnace tube set on said bottom plate, a wafer boat set on said bottom plate and inside said furnace tube for holding said semiconductor wafers, first heating means set outside of said furnace tube for providing heat to said furnace tube, cooling water means set in said bottom plate for cooling down the temperature of said system, first temperature detecting means responsive to the temperature inside of said wafer boat, second temperature detecting means responsive to the temperature inside of said furnace tube and outside of said wafer boat, and second heating means set inside of said wafer boat for providing heat to lower the temperature gradient between said first temperature detecting means and said second temperature detecting means during a heating or a cooling cycle during a phase transformation point of said quartz tube.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a conventional furnace system;

FIG. 2 is a first embodiment of a furnace system to reduce particles in a quartz tube and boat in accordance with the present invention;

DESCRIPTION OF THE PREFERRED EMBODIMENT

Figure 4:
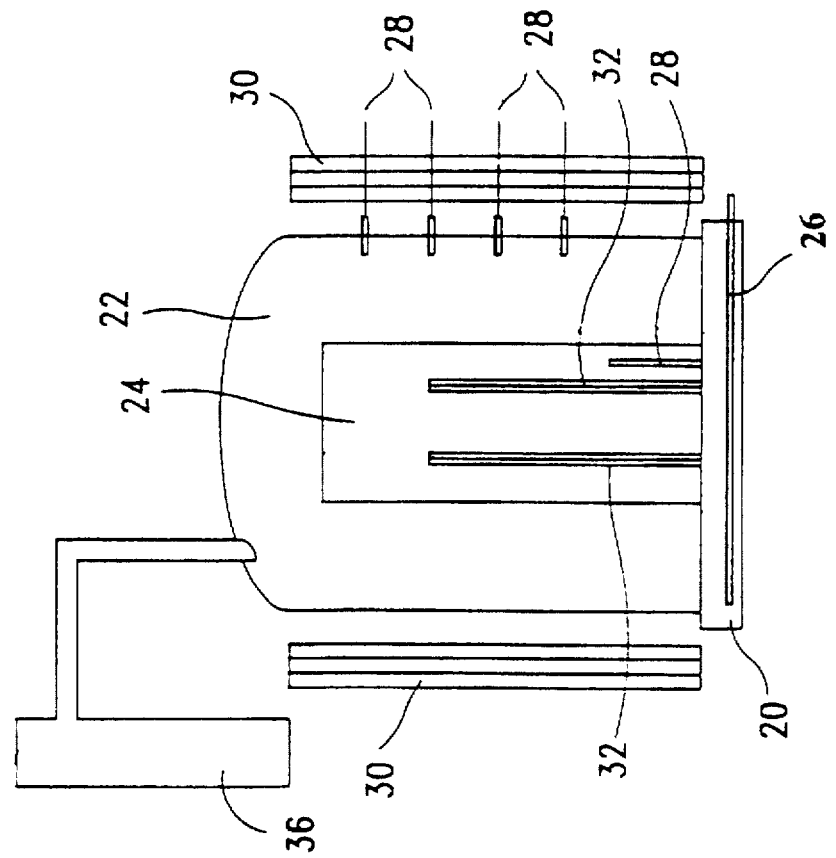
FIG. 4 is a third embodiment of a furnace system to reduce particles in a quartz tube and boat in accordance with the present invention.

FIG. 2 shows a preferred embodiment of a semiconductor furnace system formed in accordance with the present invention. The furnace system is designed to minimize thermal stress, to reduce particle generation in the quartz tube and boat, and to prolong the lifetime of both quartzwares (the tube and boat).

The present invention is identical to a prior art vertical furnace except as detailed below. In brief, secondary heating elements are used to reduce the temperature gradient in the wafer boat during the cooling stage after the completion of a process. The furnace includes a bottom plate 20, a furnace tube 22, a wafer boat 24, a water cooling means 26, thermocouples 28, first heating elements 30, and second heating elements 32. The furnace tube 22 is set onto the bottom plate 20, which serves to isolate the wafers. The wafer boat 24 is then set in the furnace tube 22 to hold the wafer boat 24. Typically, the furnace tube 22 is made of quartz.

The cooling water means 26 which is set in the bottom plate 20 is utilized to cool down the temperature of the system following completion of a process. The first heating elements 30 are set outside of the furnace tube 22 to provide heating of the furnace tube.

The second heating elements 32 are vertically set in the wafer boat 24 and on the bottom plate 20. The second heating elements 32 are used to reduce the temperature gradient in the wafer boat 24. The thermocouples 28 are used to detect the temperature inside the furnace tube 22 and inside the wafer boat 24. Some of the thermocouples 28 are set on the side wall of the furnace tube 22 and pass through the side wall of the furnace tube 22 for detecting the temperature in the furnace tube 22. Others are set in the wafer boat 24 for detecting the temperature in the wafer boat 24.

The key reason for thermal stress in the tube 22 and boat 24 is caused during phase transition of the quartz. There are three basic structures of crystalline silica: quartz, tridymite, and cristobalite. The most stable forms are low quartz, below 573° C.; high quartz, from 573°–867° C.; high tridymite, 867°–1470° C.; high cristobalite, 1470°–1710° C.; and liquid.

The common deposition temperature for polysilicon, low pressure chemical vapor deposition (nitride), and LPTEOS (low pressure tetraethylorthosilicate) are 586°–640° C., 760° C., and 720° C., respectively. The process temperature of densifying BPSG (borophosphosilicate glass), well drive-in, and field oxide are in the range between 800°–1150° C.

During a cooling cycle, phase transformation from high quartz to low quartz will occur in the range from 575°–565° C. For a drive-in or annealing process, reversible transformation between high quartz and high tridymite occurs in the temperature range of 886°–872° C.

It is important to use a suitable cooling rate or heating rate in order to reduce the thermal stresses from polymorphic transformation in these ranges on the tube 22 and the boat 24. This can be achieved by suitable heating or cooling rates, such as 0.1°–2° C./min. Thus, in both cooling and heating phases of a particular semiconductor process, heating elements 32 will be activated when the thermocouples 28 indicate a temperature near any of the phase transformation ranges.

In particular, when the thermocouples 28 detect that the temperature is within a phase transformation range, second heating elements 32 will be activated to decrease the temperature gradient between the tube 22 and the boat 24. The thermal stress which is caused by the phase transition of the quartz is reduced by the present invention.

Figure 3:
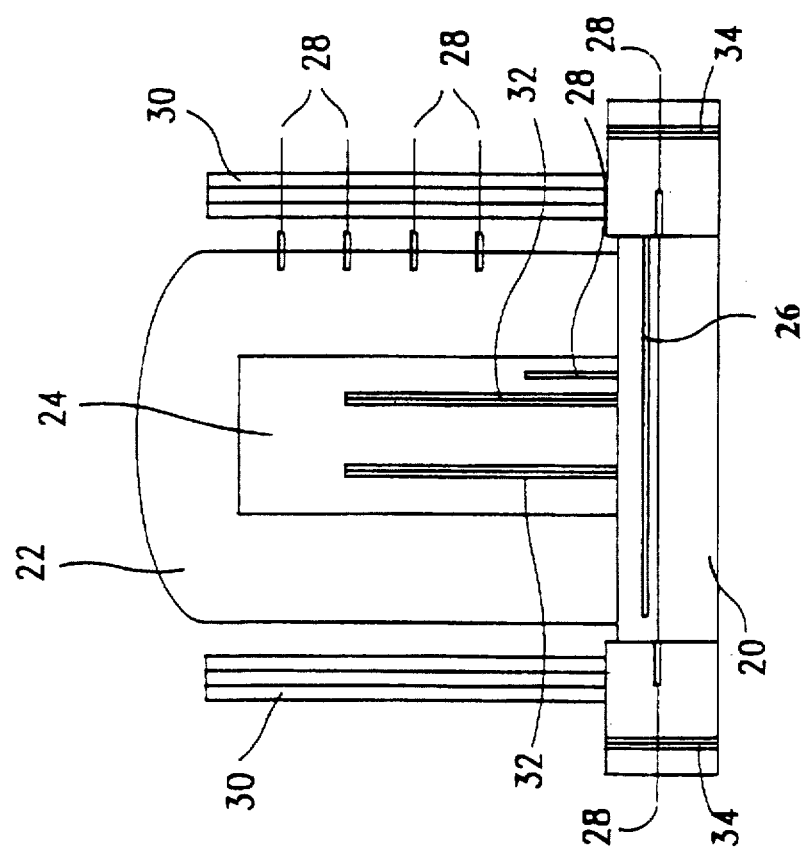
FIG. 3 is a second embodiment of a furnace system to reduce particles in a quartz tube and boat in accordance with the present invention.

In addition, turning to FIG. 3, another embodiment of the invention further comprises third heating elements 34 that are set beside the bottom plate 20 for further controlling the heating or cooling rates of the system to lower the temperature gradient. Thermocouples 28 are set beside the bottom plate 20 for detecting the temperature in the furnace 22.

In a third embodiment shown in FIG. 4, a gas injection means 36 is used to inject gas that is tightly temperature controlled. The gas can be used to reduce the temperature gradient in the furnace.

Figure 5:
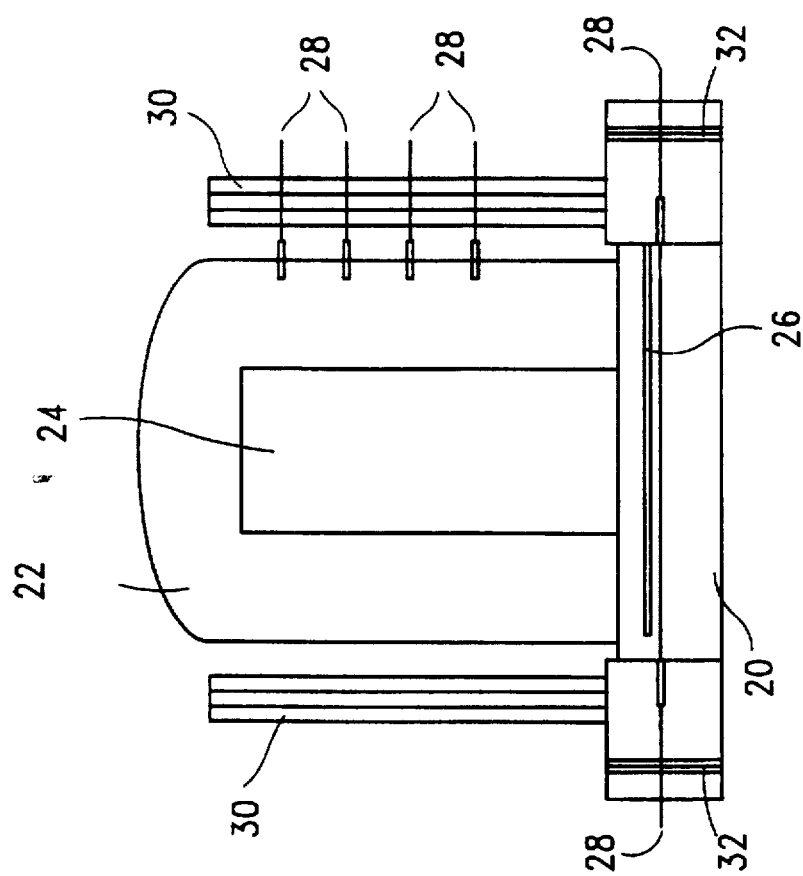
FIG. 5 is a fourth embodiment of a furnace system to reduce particles in a quartz tube and boat in accordance with the present invention.

In a fourth embodiment shown in FIG. 5, the second heating elements 32 are set beside the bottom plate 20 instead of setting in the wafer boat for further controlling the heating or cooling rates of the system to lower the temperature gradient. Further, thermocouples 28 are set beside the bottom plate 20 for detecting the temperature in the furnace 22.

As is understood by a person skilled in the art, the foregoing preferred embodiments of the present invention are illustrated of the present invention rather than limiting of the present invention. For example, the combination of the first embodiment, the gas injection means and the third heating means is also covered by the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. An improved semiconductor furnace system that reduces particles in a quartz tube and wafer boat, said system comprising:

a bottom plate;

a quartz furnace tube set on said bottom plate;

a wafer boat set on said bottom plate and inside said furnace tube for holding said semiconductor wafers;

first heating means set outside of said furnace tube for providing heat to said furnace tube;

cooling water means set in said bottom plate for cooling down the temperature of said system;

first temperature detecting means responsive to the temperature inside of said wafer boat;

second temperature detecting means responsive to the temperature inside of said furnace tube and outside of said wafer boat; and second heating means set inside of said wafer boat for providing heat to lower the temperature gradient between said first temperature detecting means and said second temperature detecting means during a heating or a cooling cycle during a phase transformation point of said quartz tube.

2. The system of claim 1 wherein the heating or cooling rates of said system is limited to between 0.1°–2° C./min.

3. The system of claim 1 wherein said second heating means is vertically set inside of said wafer boat.

4. The system of claim 1 wherein said first temperature detecting means is set on the side wall of said furnace tube.

5. The system of claim 1 wherein said second temperature detecting means is set inside of said wafer boat.

6. The system of claim 1, further comprising third heating means set beside said bottom plate.

7. The system of claim 1, further comprising third temperature detecting means set beside said bottom plate responsive to the temperature inside of said furnace.

8. The system of claim 1, further comprising gas injection means connected to said furnace tube for inserting a gas to surround the inside of said furnace tube to lower the temperature gradient inside said furnace tube.

9. An improved semiconductor furnace system that reduces particles in a quartz tube and wafer boat, said system comprising:

a bottom plate;

a quartz furnace tube set on said bottom plate;

a wafer boat set on said bottom plate and inside said furnace tube for holding semiconductor wafers;

first heating means set outside of said furnace tube for providing heat;

cooling water means set in said bottom plate for cooling said system;

first temperature detector means responsive to the temperature inside of said wafer boat;

second temperature detector means responsive to the temperature inside of said furnace and outside of said wafer boat;

second heating means set inside of said furnace tube for providing heat to lower the temperature gradient during a heating or cooling cycle during the phase transformation point of the quartz tube;

gas injection means connected to said furnace tube for inserting a gas to surround the inside of said furnace tube to lower the temperature gradient inside said furnace tube; and third heating means set beside said bottom plate for controlling the temperature gradient inside said furnace during said cooling or heating cycle.

10. The system of claim 9 wherein the heating or cooling rates of said system is about 0.1°–2° C./min.

11. The system of claim 9 wherein said second heating means is vertically set inside of said wafer boat.

12. The system of claim 9 wherein said first temperature detector means is set on the side wall of said furnace tube.

13. The system of claim 9 wherein said second temperature detector means is set inside of said wafer boat.

14. An improved semiconductor furnace system that reduces particles in a quartz tube and wafer boat, said system comprising:

a quartz furnace tube set on said bottom plate;

a wafer boat set on said bottom plate and inside said furnace tube for holding semiconductor wafers;

first heating means set outside of said furnace tube for providing heat;

cooling water means set in said bottom plate for cooling said system;

first temperature detector means responsive to the temperature inside of said furnace and outside of said wafer boat;

second temperature detector means set beside said bottom plate responsive to the temperature inside of said quartz furnace tube; and second heating means set beside said bottom plate for controlling the temperature gradient inside said furnace during said cooling or heating cycle.

15. The system of claim 14 wherein the heating or cooling rates of said system is about 0.1°–2° C./min.

16. The system of claim 14 wherein said first temperature detector means is set on the side wall of said furnace tube.

* * * * *